United States Patent [19]  [11] 4,048,519
Hoffmann et al. [45] Sept. 13, 1977

[54] REGENERATOR CIRCUIT FOR CCD ELEMENTS

[75] Inventors: Kurt Hoffmann, Taufkirchen; Günther Meusburger; Gottfried Wotruba, both of Munich, all of Germany

[73] Assignee: Siemens Aktiengesellschaft, Berlin & Munich, Germany

[21] Appl. No.: 717,705

[22] Filed: Aug. 25, 1976

[30] Foreign Application Priority Data

Sept. 18, 1975 Germany .............................. 2541686

[51] Int. Cl.² .................... H01L 29/78; H03K 5/18; G11C 19/28
[52] U.S. Cl. ................................. 307/221 D; 307/304; 307/350; 307/DIG. 1; 307/DIG. 3; 307/DIG. 4; 357/24
[58] Field of Search .................... 307/221 D, 264, 270, 307/304, 350, 352, 354, 362, 363, 246, DIG. 1, DIG. 4, DIG. 3; 357/24

[56] References Cited

U.S. PATENT DOCUMENTS

| 3,623,132 | 11/1971 | Green ........................ 307/DIG. 3 X |
| 3,758,794 | 9/1973 | Kosonocky ............... 307/DIG. 3 X |
| 3,760,381 | 9/1973 | Yao ............................. 307/DIG. 3 X |
| 3,814,955 | 6/1974 | Itoh et al. ........................... 307/304 |
| 3,900,743 | 8/1975 | Weimer ..................... 307/DIG. 1 X |
| 3,949,245 | 4/1976 | Emmons ....................... 307/221 D X |
| 3,949,381 | 4/1976 | Dennard et al. .......... 307/DIG. 3 X |
| 3,969,634 | 7/1976 | Su et al. .......................... 307/221 D |
| 3,986,059 | 10/1976 | Mohsen ....................... 307/221 D X |

OTHER PUBLICATIONS

Dennard et al, "Read/Write Amplifier for Charge--Coupled Device Memory"; *IBM Tech. Discl. Bull.;* vol. 14, No. 12, pp. 3722-3723; May 1972.
Dennard, "Regeneration Circuit for CCD Shift Registers"; *IBM Tech. Discl. Bull.;* vol. 14, No. 12, pp. 3791-3792; May 1972.
Ibrahim et al, "4096-Bit CCD Serial Memory Array"; 1973 *Int'l Electron Devices Meeting (Technical Digest),* March 5, 1973; pp. 141-143.

*Primary Examiner*—John S. Heyman
*Assistant Examiner*—Larry N. Anagnos
*Attorney, Agent, or Firm*—Hill, Gross, Simpson, Van Santen, Steadman, Chiara & Simpson

[57] ABSTRACT

Regenerator circuit for CCD elements in which charge representing information is transferred from a first CCD element to a second CCD element. The circuit includes a first MOS capacitance and a second capacitance connected in series with the first capacitance, the point at which the two capacitances are connected with one another being connected to the input of said second CCD. The output of the first CCD includes an output stage having an output diffusion zone. A transistor is connected between a terminal to which a potential $\phi_v$ can be connected and the point between said first and second capacitances. This transistor has a gate electrode which is connected by a line to the output diffusion zone of the first CCD.

6 Claims, 6 Drawing Figures

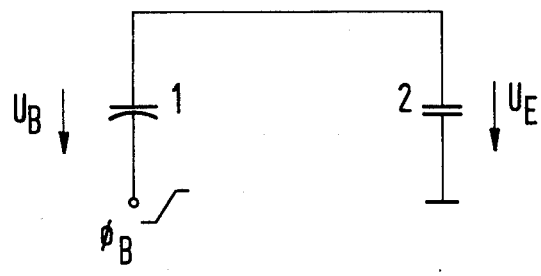
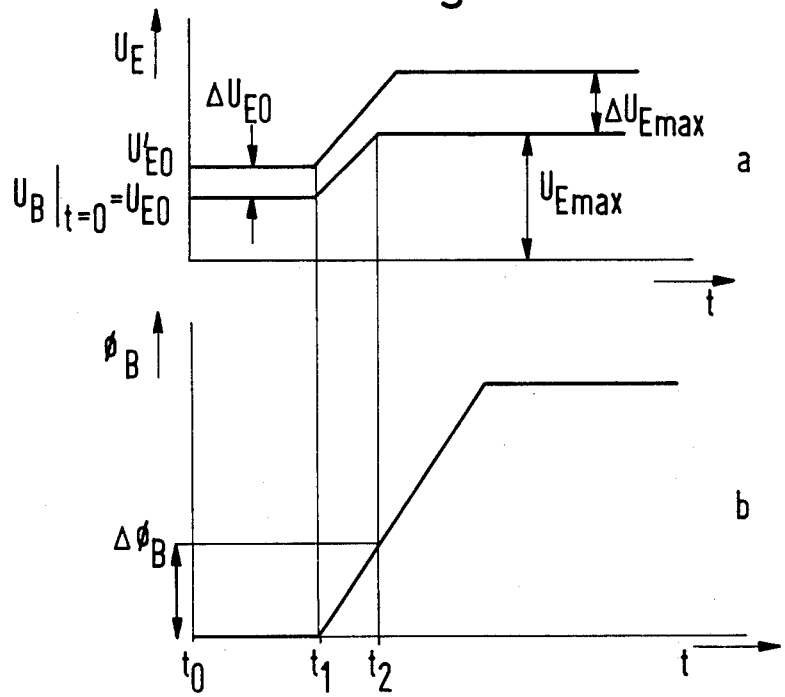

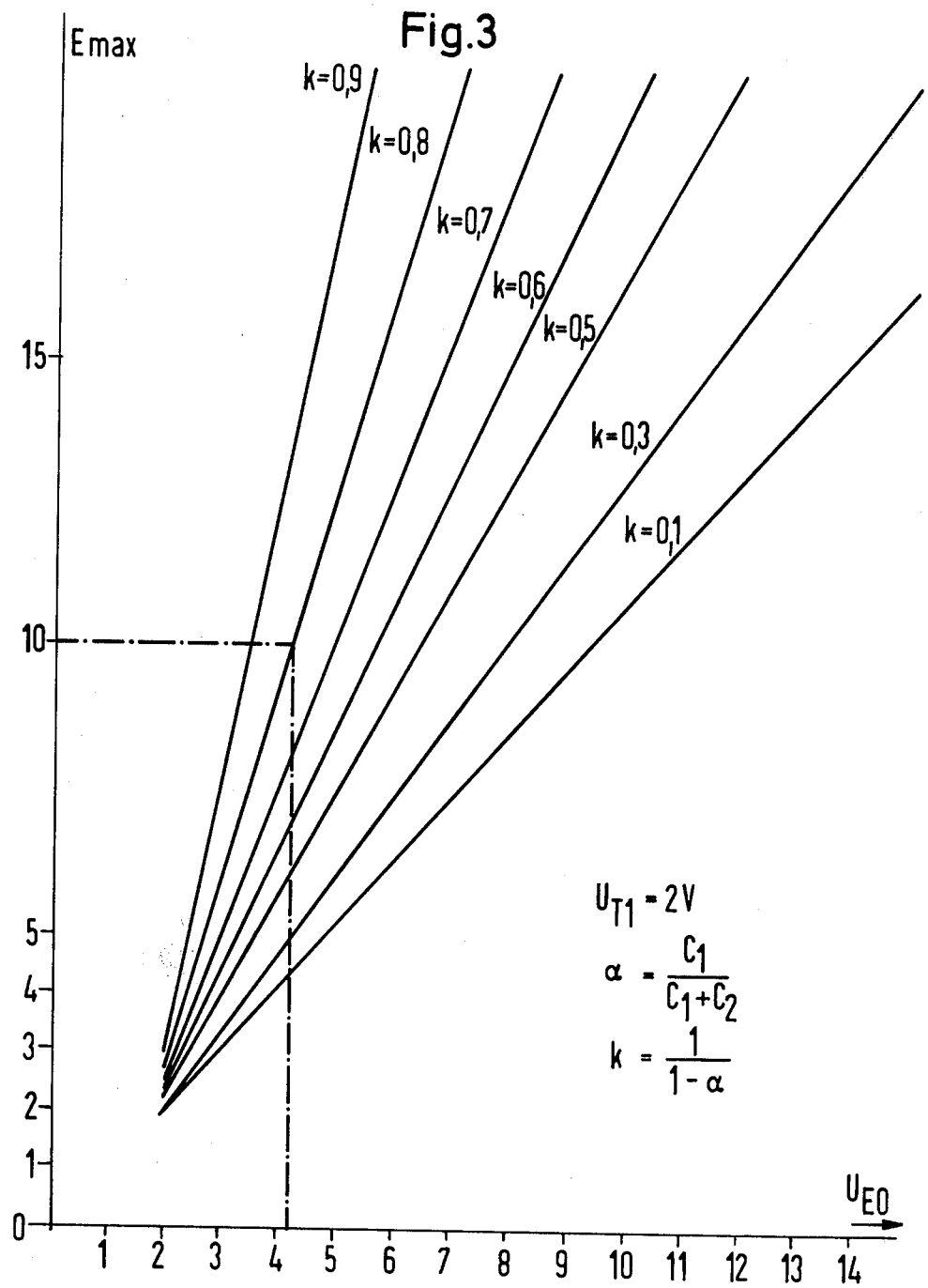

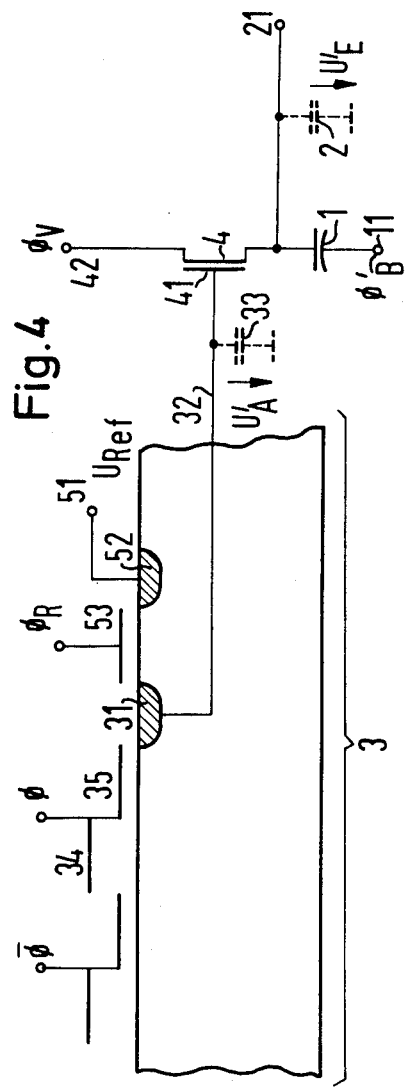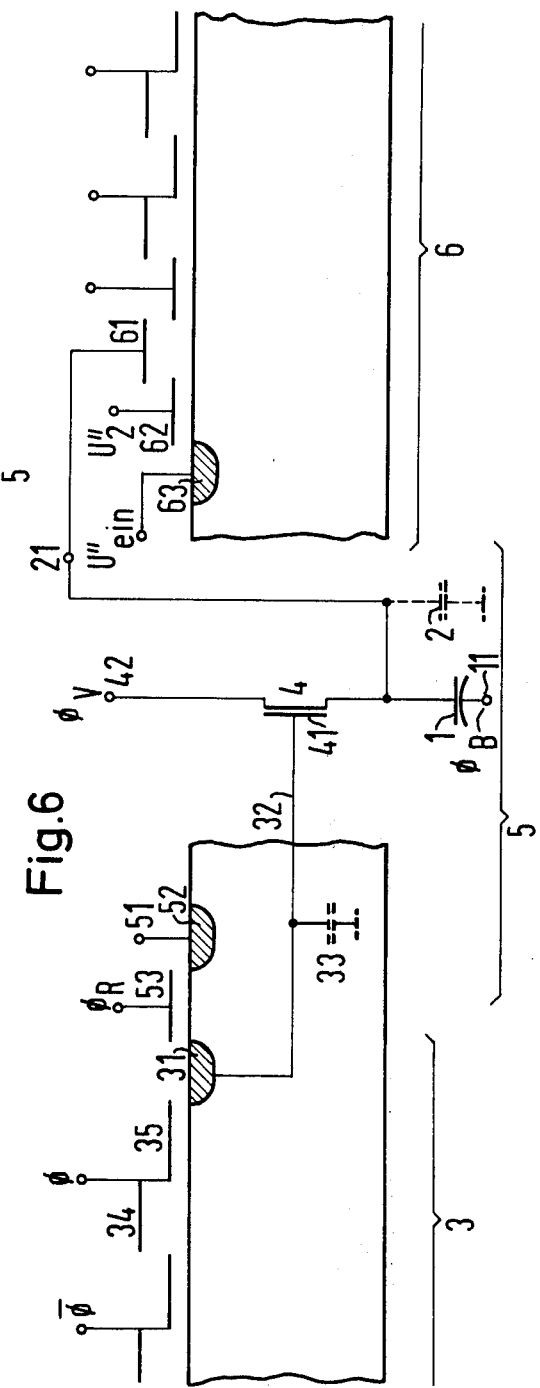

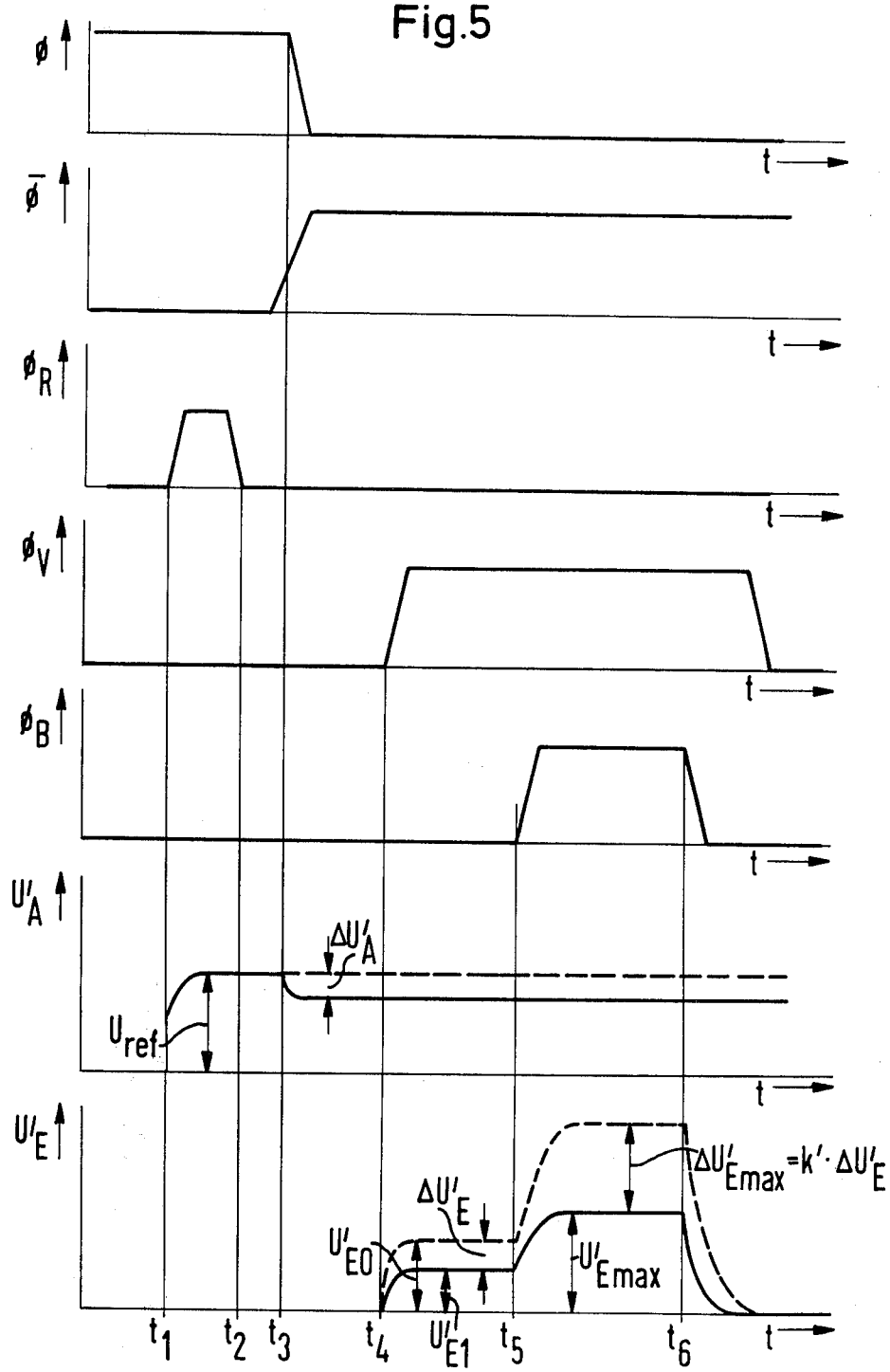

REGENERATOR CIRCUIT FOR CCD ELEMENTS

BACKGROUND OF THE INVENTION

The invention relates to a regenerator circuit for CCD elements in accordance with the CCD principle (charge-coupled-device principle).

CCD elements are increasingly gaining in significance in association with integrated storage circuits, as they enable high bit densities to be reached. The more highly integrated the circuit is with uniform overall surface area, the smaller are the dimensions of the CCD arrangements. At the same time, however, the quantity of charge which represents the information becomes smaller so that the signal recognition becomes more difficult. This results in the need for more highly sensitive amplifier circuits.

As described, for example, in W. F. Kosonocky and I. E. Carnes, "Charge-Coupled Digital Circuits", IEEE Journ. of Solid-State Circuits, Vol. SC-6, No. 5, October 1971, p. 314–322, and in N. G. Vogl and T. U. Marroun, "Operating Memory Systems Using Charge-Coupled-Devices", Digest of ISSCC 1972, p. 246, in known regenerator circuits the principle of an inverter is used. Here a disadvantage arises that the operating frequency of the entire CCD arrangement is limited simply by the relatively low operating frequency of the inverter regenerator circuit. As a consequence, the CCD arrangements cannot be exploited in terms of their overall frequency. A further disadvantage of such known regenerator circuits consists in their low amplification.

SUMMARY OF THE INVENTION

The object of the invention is to provide a regenerator circuit for CCD elements, whose cut-off frequency and whose amplification factor are higher than the cut-off frequency and amplification factor of the known circuits.

An essential advantage of the present invention lies in the fact that it enables an amplification factor $k$ of 5 to 10 to be achieved.

A further advantage of the invention lies in the fact that it enables a cut-off frequency of the overall circuit of approximately 1 MHz to be achieved.

Advantageously, the regenerator circuits in accordance with the invention are suitable both for the digital as well as for analogue operation of CCD arrangements.

Further details of the invention are given in the description and the Figures.

BRIEF DESCRIPTION OF THE DRAWINGS

FIG. 1 is an equivalent circuit diagram in explanation of the amplification principle of the invention;

FIGS. 2 and 3 show the curves of regenerator circuits in accordance with the invention;

FIG. 4 schematically illustrates the connection of a regenerator circuit in accordance with the invention to an output-CCD-stage;

FIG. 5 shows the pulse train program for a circuit as illustrated in FIG. 4; and FIG. 6 shows the arrangement of a regenerator circuit in accordance with the invention between a CCD-output stage and a CCD-input stage.

DESCRIPTION OF THE PREFERRED EMBODIMENTS

First, the amplification principle of the invention will be explained in detail making reference to FIGS. 1 to 3.

FIG. 1 illustrates a series connection of a MOS capacitor 1 and a second capacitor 2. Here the capacitor 2 is to have a constant capacitance. The capacitor 2 is preferably connected to ground potential at its free end. The free electrode of the capacitor 1 can be connected to the potential $\phi_B$. The voltage connected to the capacitor 1 is referenced $U_B$ and the voltage connected to the capacitor 2 is reference $U_E$.

At the time $t_0$ (FIG. 2a) the capacitor 2 will be assumed to be pre-charged to a potential $U_{EO}$, where at the time $t_0$ this voltage $U_{EO}$ is greater than the voltage $U_{T1}$. Here $U_{T1}$ is the start voltage of the MOS capacitor 1. At the following time $t_1$, the pulse train $\phi_B$ is switched on and as a result of the capacitive coupling across the capacitor 1, an increase in voltage occurs across the capacitor 2. In the course of the increase in the pulse train $\phi_B$, the voltage $U_B$ dropping across the capacitor 1 reduces. If the voltage $U_B$ reaches or undershoots the value of the start voltage $U_{T1}(\Delta\phi_B)$ of the MOS capacitor 1, the inversion layer disappears on the MOS capacitor, and the capacitive coupling is terminated if the parasitic overlapping capacitances are disregarded.

FIG. 2 illustrates the termination of the capacitive coupling at the time $t_2$, where the pulse train $\phi_B$ (FIG. 2b) has produced a voltage $U_{Emax}$ until the amplitude $\phi_B$ is reached across the capacitor 2 (FIG. 2a). This process has been described by R. E. Joynson, I. L. Mundy, I. F. Burgess. C. Neugebaur "Eliminating Threshold Losses in MOS-circuits by Bootstrapping using varactor coupling", in IEEE Journal of Solid-State Circuits, Vol. SC-7, No. 3, June 1972, p. 217 to 224.

In accordance with the invention, this process is now used to amplify signals. To this end the fact is exploited that in the presence of a pre-charging voltage $U'_{EO}$ which, for example, is higher than the voltage $U_{EO}$, on the connection of the pulse $\phi_B$ a considerably higher maximum voltage $U'_{Emax} > U_{Emax}$ is reached. The state of the circuit corresponding to FIG. 2a at time $t_2$ is described by the equations $$U_{Emax} = \Delta\phi_B + U_{T1}(\Delta\phi_B) \tag{1}$$

$$U_{Emax} = \Delta\phi_B \cdot \alpha + U_{EO} \tag{2}$$

In these equations the term $\Delta\phi_B$ signifies that amplitude of the pulse train $\phi_B$ up to which a channel exists in the MOS capacitor. $U_{T1}(\Delta\phi_B)$ designates the start voltage of the MOS capacitor 1, and $\alpha$ is $$C_1/(C_1 + C_2)$$

If one disregards the substrate control effect described by R. M. Crawford, "MOSFET in Circuit Design" in McGraw Hill, 1967, p. 39, the start voltage of the MOS capacitor is a constant $U_{T1}$ and the amplification factor becomes $$V\Big|U_T = \text{const} = \frac{U_{Emax}}{U_{EO}} = \frac{1}{1-\alpha} = k. \tag{3}$$

FIG. 3 illustrates the maximum voltages $U_{Emax}$ calculated including the substrate control effect in accordance with the equations (1) and (2), in dependence upon various pre-charging voltages $U_{EO}$ for various quotients $\alpha = C_1/(C_1 + C_2)$. Here a start voltage with a nominal value of $U_{T1} = 2\ V$ has been assumed. It will be seen from the characteristic curves that for example with a quotient $k = 0.8$, an amplification factor $v - 3 < V|U_T = $ const is achieved.

In the following, the function of the new regenerating circuit for CCD arrangements will be explained making reference to the circuit illustrated in FIG. 4. Here 3 designates the output stage of a CCD known per se. The capacitors which have already been mentioned in association with the preceding figures bear the corresponding references. The output diffusion zone 31 of the output stage 1, which is constructed in a conventional manner, is connected via a line 32 to the gate terminal 41 of a transistor 4. The transistor 4 is connected on the one hand to terminal 42 and on the other hand to the electrode of the MOS capacitor 1. The other electrode of this capacitor is on the other hand connected to the terminal 11, to which the potential $\phi_B{'}$ can be connected. The one electrode of the MOS capacitor 1 is also connected to the output terminal 21 of the regenerator circuit corresponding to the invention which is referenced 5. The capacitor 2 here consists of the input capacitance of the circuit which is connected to the terminal 21 and which, for example, can be a read-out circuit or another CCD circuit.

In the following, the mode of functioning of the circuit shown in FIG. 4 will be described in association with the pulse train program illustrated in FIG. 5. In the time interval between $t_1$ and $t_2$ the output capacitance 33 of the output stage 3 is pre-charged to the reference potential $U_{ref}$. The output capacitance 33 is formed from the overall capacitance of the diffusion zone 31, the gate capacitance of the transistor 4, and the capacitance of the connection line 32. To charge the capacitance 33 to the reference potential $U_{ref}$, the potential $U_{ref}$ is connected via the terminal 51 to the diffusion zone 52. Together with the gate electrode 53 and the output diffusion zone 31 of the CCD output stage 3, the diffusion zone 52 represents a field effect transistor. During the times $t_1$ to $t_2$, the gate terminal 53 of this transistor is connected to a potential $\phi_R$ which brings the transistor into the conductive state. At the following time $t_3$, as a result of the disconnection of the pulse train $\phi$ which, for example, is connected to the last pair of shift electrodes 34 and 35 of a two-phase CCD, for example, a quantity of charge corresponding to a binary 1 passes to the diffusion zone 31. In this way, a change in voltage $\Delta U'_A$ is brought about across the capacitor 33.

At the time $t_4$, the pulse train $\phi_v$ which is connected to the terminal 42 of the transistor 4, is switched on; then, via the conductive transistor 4, the capacitance 2 is pre-charged to the potential $U_{ref} - \Delta U'_A - U_{T4} = U'\lambda_{E''1''}$, where the voltage $U_{T4}$ is the start voltage of the transistor 4. The voltage $U'_{E''1''}$ across the capacitor 2 corresponds to the pre-charging voltage $U_{EO}$ of the capacitor 2 in FIG. 1.

Then, at the time $t_5$ the pulse train $\phi_B{'}$ at the terminal 11 is switched on and by means of capacitive coupling the voltage $U'_E$ is raised to the maximum limit $U'_{Emax}$.

The Figure also shows the voltage curves for the event in which at the time $t_3$ no charge reaches the diffusion zone 31, as corresponds, for example, to a binary 0. In this case, the pre-charging voltage $U_{ref}$ remains connected to the capacitor 33 and at the time $t_4$ the capacitor 2 is pre-charged to the voltage $U_{ref} - U_{T4} = U'_{E''O''}$.

For a satisfactory functioning of the circuit, it is essential that $U'_{E''O''} > U'_{T1}(\Delta\phi_B)$, where $U'_{T1}(\Delta\phi_B)$ is the start voltage of the MOS capacitor 1.

At the time $t_5$, the pulse train $\phi_B{'}$ is again switched on, where the voltage $U'_E$ across the capacitor 2 is raised to the amount $U'_{Emax} + k' \cdot \Delta U'_E$ as a result of the pre-charging voltage $U'_{E''O''} > U'_{E''1''}$. Thus, after the time $t_5$, the read-out signal $\Delta U'_{Emax} = k' \cdot \Delta U'_A = k' \cdot \Delta U'_E$, which has been amplified by the amplification factor $K' = (C_1 + C_2)/C_2$, is ready for further processing across the capacitor 2.

FIG. 6 illustrates a preferred embodiment of the regenerator circuit in accordance with the invention which is arranged between the CCD output stage 3 already represented in association with FIG. 4, and a CCD input stage 6. Details of FIG. 6 which have already been described in association with FIG. 4, bear the corresponding references. The signal $\Delta U_{Emax}$ which has been connected to the terminal 21 and has been amplified in the regenerator circuit 5 in accordance with the invention, is connected to the second electrode 61, which, for example, when the circuit of the invention and the CCD stages 3 and 6 are designed in a silicon-aluminum technique, is in the form of an aluminum-gate-electrode of the second plane. As the start voltage of the aluminum-gate transistor is generally higher than that of the silicon-gate transistors, the operating range of the regenerator circuit is also better exploited. Here the operating range of the CCD input circuit is set with the two potentials $U_{Ein}{''}$ and $U_2{''}$. Here the voltage $U''_{Ein}$ is connected to the input diffusion zone 63 of the input stage 6, and the voltage $U''_2$ is connected to the silicon electrode 62, arranged next to this diffusion zone 63, of the first plane.

It will be apparent to those skilled in the art that many modifications and variations may be effected without departing from the spirit and scope of the novel concepts of the present invention.

We claim as our invention:

1. Regenerator circuit for CCD elements comprising a first CCD and a second CCD, a first MOS capacitance, a second capacitance connected in series with said first capacitance, the point at which said two capacitances are connected in series with one another being the output of said regenerator circuit and being connected to an input electrode of said second CCD, the output of said first CCD including an output stage, an output diffusion zone, a terminal to which a potential $\phi_v$ can be connected, a transistor connected on the one hand to said point and on the other hand to said terminal, a gate electrode of said transistor being connected by a line to said output diffusion zone of said first CCD stage.

2. Process for operating a circuit as set forth in claim 1 in which the output capacitance of said output stage is pre-charged to a reference potential $U_{ref}$ (time $t_1$ and $t_2$), said output capacitance being formed by the overall capacitance of said diffusion zone, the gate capacitance of said transistor and the capacitance of said connection line between said transistor and said output diffusion zone, and that in order that the output capacitance of said first CCD be charged to the reference potential $U_{ref}$ the latter is connected to a second diffusion zone of said first CCD, which, together with the first output diffusion zone and a gate electrode forms a field effect transistor, which field effect transistor is switched conductive as a result of the connection of a potential $\phi_R$ to its gate electrode, that from the first CCD a quantity of charge corresponding to a binary 1 or a binary 0 is pulsed to said first output diffusion zone (time $t_3$), that the quantity of charge corresponding to a binary 1 results in a change in voltage $U_A'$ across said first capacitance, and that a quantity of charge corresponding to a binary 0 results in no change in voltage across said first capacitance, that said transistor is switched conductive by the potential $\phi_V$ across its terminal (time $t_4$), as a result of which in the case of a binary 1 the second capacitance is pre-charged to the potential $U_{ref} - \Delta U_A' - U_{T4}$ and in the case of a binary 0 is pre-charged to the potential $U_{ref} - U_{T4}$, that a pulse train $\phi_B$ to said electrode of said MOS capacitor is switched on (time $t_5$) as a result of which due to capacitive coupling the voltage across said second capacitance is raised to a maximum limit $U_{Emax}'$ in the case of a binary 1, and to the maximum limit $U_{Emax}' + k \cdot \Delta U_E$ in the case of a binary 0, and that in the case of a binary 0, the voltage $U_{ref} - U_{T4}$ is greater than the start voltage of the MOS capacitor.

3. Regenerator circuit for CCD elements comprising a first MOS capacitance, a second capacitance connected in series with said first capacitance, the point at which said two capacitances are connected in series with one another being the output of the regenerator circuit and being connected to an input electrode of an input CCD, a terminal to which a potential $\phi_V$ can be connected, a transistor connected on the one hand to said point and on the other hand to said terminal, a gate electrode of said transistor being connected via a line to an output diffusion zone of an output CCD stage.

4. Regenerator circuit as set forth in claim 3, in which said first capacitance consists of the input capacitance of the connected CCD circuit.

5. Regenerator circuit as set forth in claim 3 which is constructed in a MOS-aluminum-silion-gate field effect technique.

6. Regenerator circuit as set forth in claim 3 which is constructed in a solid-silicon-technique or in a SOS technique.

* * * * *